(12) United States Patent
Madore

(10) Patent No.: US 6,714,010 B2
(45) Date of Patent: Mar. 30, 2004

(54) COMBINING UNFOLD WITH PARALLEL MAGNETIC RESONANCE IMAGING

(75) Inventor: Bruno Madore, Brookline, MA (US)

(73) Assignee: Brigham and Women's Hospital, Inc., Boston, MA (US)

( * ) Notice: Subject to any disclaimer, the term of this patent is extended or adjusted under 35 U.S.C. 154(b) by 0 days.

(21) Appl. No.: 10/125,984

(22) Filed: Apr. 19, 2002

(65) Prior Publication Data

US 2002/0153890 A1 Oct. 24, 2002

Related U.S. Application Data

(60) Provisional application No. 60/285,399, filed on Apr. 20, 2001.

(51) Int. Cl.[7] .................................................. G01V 3/00
(52) U.S. Cl. ...................................................... 324/307
(58) Field of Search ................................. 324/307, 309

(56) References Cited

U.S. PATENT DOCUMENTS

| | | | | |
|---|---|---|---|---|
| 5,910,728 A | * | 6/1999 | Sodickson | 324/309 |
| 6,144,873 A | * | 11/2000 | Madore et al. | 600/410 |
| 6,289,232 B1 | * | 9/2001 | Jakob et al. | 600/410 |
| 6,353,752 B1 | | 3/2002 | Madore et al. | 600/410 |
| 6,476,606 B2 | * | 11/2002 | Lee | 324/309 |
| 6,492,814 B1 | * | 12/2002 | Watkins et al. | 324/318 |
| 6,556,009 B2 | * | 4/2003 | Kellman et al. | 324/309 |
| 6,556,010 B2 | * | 4/2003 | Van Den Brink et al. | 324/309 |

OTHER PUBLICATIONS

Notification of Transmittal of The International Search Report or the Declaration, mailed Apr. 22, 2002.

* cited by examiner

*Primary Examiner*—Christopher W. Fulton
*Assistant Examiner*—Dixomara Vargas
(74) *Attorney, Agent, or Firm*—Mintz, Levin, Cohn, Ferris, Glovsky and Popeo, P.C.

(57) ABSTRACT

A method for combining UNFOLD with a parallel magnetic resonance imaging (MRI) technique, such as SMASH, SENSE, or SPACE-RIP is provided. When acquiring only one $n^{th}$ of the usual amount of k-space data, data is acquired n times faster, but n signals will overlap in the resulting images. By spreading the n signals over all of the available temporal frequency bandwidth, UNFOLD reduces the amount of overlap to n/2. A parallel imaging method with an acceleration n/2 can finish the reconstruction by separating the n/2 overlapped signals. The result is a time series of non-corrupted images that are acquired n times faster than normal.

20 Claims, 4 Drawing Sheets

**Acquired FOV
Four-fold aliasing
overlap of regions
A, B, C and D**

(PRIOR ART)

Image pixel where
$P_A$, $P_B$, $P_C$, $P_D$ overlap

Reconstructed FOV
B, C fully dynamic,
A, D less dynamic

ACQUIRED FOV
FOUR-FOLD ALIASING

RECONSTRUCTED FOV
LESS DYNAMIC
FULLY DYNAMIC
LESS DYNAMIC

COMBINING UNFOLD WITH PARALLEL MAGNETIC RESONANCE IMAGING

This application claims that benefit of provisional application Ser. No. 60/285,399 filed on Apr. 20, 2001.

FIELD OF THE INVENTION

The present application relates generally to reconstruction methods for magnetic resonance (MR) image data.

BACKGROUND OF THE INVENTION

UNFOLD is a method disclosed in U.S. Pat. No. 6,144,873 to Madore et al., which is herein incorporated by reference, for data encoding to improve temporal resolution in magnetic resonance imaging. UNFOLD can provide an acceleration rate of nearly 2. Parallel imaging forms a family of methods that also aim at improving temporal resolution in MRI. SMASH and SENSE are examples of parallel imaging methods.

It has previously been proposed to combine the methods of UNFOLD with SENSE or SMASH in the publication entitled *Method for Combining UNFOLD with SENSE or SMASH,* 8 PROC. INTL. SOC. MAG. RESON. MED. 1507 (2000) by Peter Kellman & Elliot R. McVeigh. When the UNFOLD method is combined with SENSE or SMASH, acceleration is nearly doubled compared to using SMASH or SENSE alone. With the disclosed method, however, the dynamic portion of the field of view (FOV) is typically constrained to one quarter of the FOV. Thus, the remaining three-quarters of the FOV typically cannot display fully dynamic features of the image sought to be viewed. In contrast, the present method provides high temporal resolution to a region twice bigger; i.e., half the FOV.

SUMMARY OF THE INVENTION

One embodiment of the invention is a method for combining an UNFOLD technique with a parallel MR imaging technique to obtain of an object an MR image having a one-half dynamic portion. The method includes (a) obtaining k-space information about the object at a first time point and a first set of k-space locations; (b) obtaining k-space information about the object at a second time point and a second set of k-space locations, wherein at least one of the k-space locations in said second set is not contained in said first set, (c) obtaining information for images at the first and the second time points using the first and the second sets of k-space data, respectively, said images containing spatially aliased and non-aliased components, the image having image pixels; (d) decomposing time variations of one of the image pixels into its frequency content; (e) for a predetermined frequency of the frequency content, using a parallel imaging technique to separate the aliased and the non-aliased components that are overlapped; (f) repeating step (e) for a plurality of frequencies; and (g) repeating steps (d) through (f) for a plurality of image pixels.

An advantage of one or more embodiments of the invention include combining the MRI techniques of UNFOLD with parallel imaging while retaining one-half of a dynamic field of view and obtaining an acceleration nearly twice higher than would be obtained with parallel imaging alone.

DETAILED DESCRIPTION OF THE INVENTION

Figure 1:
FIG. 1 is a diagram of an image pixel after combining UNFOLD with a parallel magnetic imaging technique without using the invention.
Figure 1B:
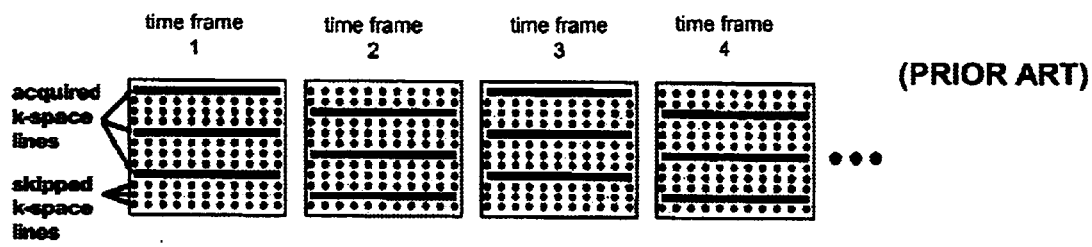
FIG. 1B is a diagram of time frames showing the UNFOLD acquisition technique.

FIG. 1 shows a representation of an image pixel 10 where an acceleration factor of 4 was achieved, but the acquired data is reconstructed normally instead of using the present method. The data is obtained by acquiring only one line of every 4, and shifting the sampling function by 2 lines from time frame to time frame, as required by UNFOLD (See FIG. 1B). Due to four-fold spatial aliasing, the image pixel 10 has the data for four spatial points $P_A$, $P_B$, $P_C$ and $P_D$ located therein. The spatial aliasing occurred because not enough k-space data was acquired for the area of the MRI image sought to be produced. In this example, only a quarter of all the k-space lines were actually measured, and without correction the acquired field of view (FOV) is 4 times smaller than the full FOV to be reconstructed. If the data of FIG. 1 is reconstructed without correction, an image such as that shown in FIG. 7 would be shown in which at each pixel, the data for four spatial points would be displayed.

Figure 2:
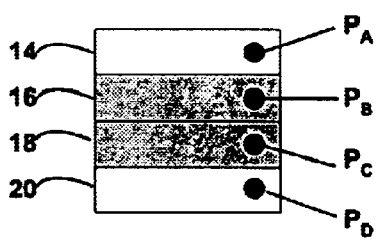
FIG. 2 is a diagram of four image pixels after using an embodiment of the invention on the data of the image pixel of FIG. 1.

FIG. 2 shows a representation of four image pixels 14, 16, 18 and 20 labeled $P_A$, $P_B$, $P_C$ and $P_D$, correctly separated and mapped after applying one of the embodiments of the invention. Each spatial point $P_A$, $P_B$, $P_C$ and $P_D$ corresponds to only one pixel. The spatial points 16 and 18 are fully dynamic and thus can display a dynamic object. The spatial points 14 and 20 are less dynamic and cannot fully show the dynamic properties of an object.

Figure 3:
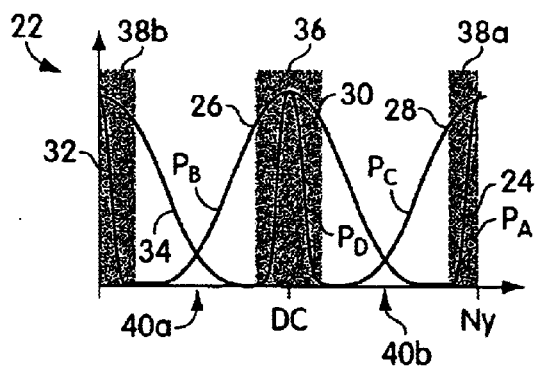
FIG. 3 is a graph of amplitude vs. frequency for an image pixel that has four spectra after acquiring data using UNFOLD with parallel magnetic imaging technique.

FIG. 3 shows a spectrum 22 for the pixel 10 of FIG. 1 in the temporal frequency domain before using the present invention. The spectrum 22 can be obtained by taking the fast Fourier transform of the pixel 10 of FIG. 1. The spectrum has spectral information for four spectra 24 (and 32), 26, 28 (and 34) and 30 that correspond to spatial points $P_A$, $P_B$, $P_C$ and $P_D$. The spectra 26 and 28 (and 34) for $P_B$ and $P_C$ are wider than the spectra 24 (and 32) and 30 for $P_A$ and $P_D$ because they correspond to fully dynamic material in the imaged object rather than less dynamic material. In this example, no more than two of the four spectra overlap at any given temporal frequency. For example, spectra 26 and 30 for $P_B$ and $P_D$ overlap in the shaded area 36 around direct current (DC). Spectra 24 and 28 for $P_A$ and $P_C$ overlap in the shaded areas 38a around Nyquist. Spectra $P_B$ and $P_C$ overlap at 40 and 40b in the spectrum. Spectra like the one in FIG. 3 are cyclic, meaning that the right-most frequency point in the spectrum is actually the same as the left-most one, both of which are the Nyquist Frequency. Thus, region 38a and 38b form really only one continuous region.

Embodiments of the invention take advantage that only two spectra overlap at any given temporal frequency. (At any given temporal frequency, 2 of the 4 spectra in FIG. 3 are assumed to have a negligible contribution.) The other two overlapped signals of this given frequency would be separated using an MR imaging technique, such as parallel imaging.

With the invention, UNFOLD is combined with a parallel imaging technique, such as SENSE or SMASH. SENSE is typically applied to a time series of images one time frame at a time. However, because of the linearity characteristic of the Fourier transform, SENSE can also be applied one temporal frequency at a time. SENSE is able to separate two overlapped signals at any one frequency. The SENSE technique can be provided with information that certain spectra did not contribute to a specific frequency being considered by SENSE. For example, SENSE can be provided with information that spectra 24 and 28 for $P_A$ and $P_C$ are known to have not contributed to the measured DC signal, for example. This is done by zeroing the regions 14 and 18 of the FOV in FIG. 2 in all the sensitivity maps that are input into SENSE for the treatment of DC, which will "inform" SENSE that only 2 spatial points, $P_B$ and $P_D$, are overlapped when considering DC signal. Thus, SENSE will be able to separate the $P_B$, and $P_D$ signals at DC and the two overlapped signals at any given frequency in FIG. 3.

Flowcharts

Figure 4:
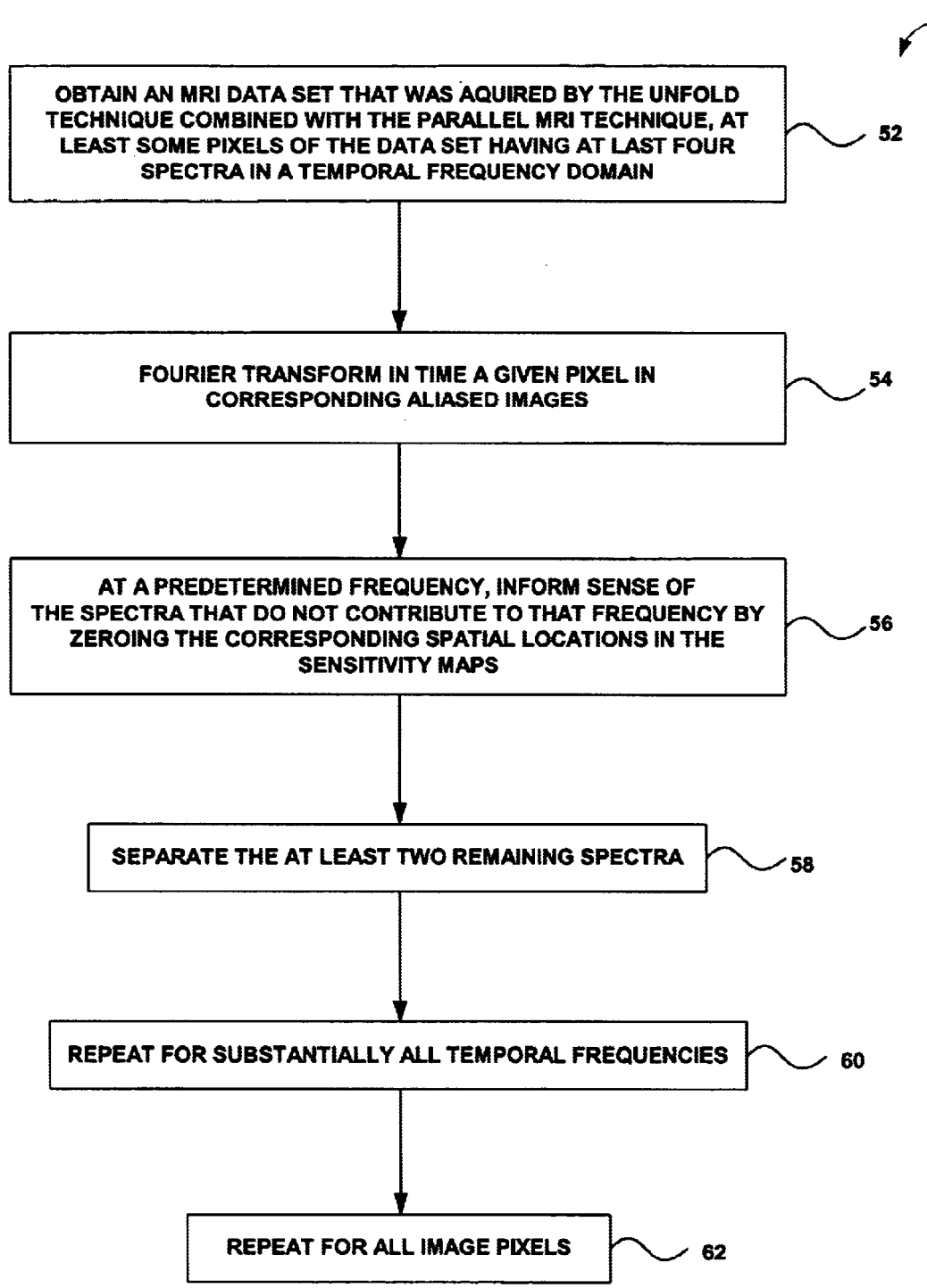
FIG. 4 is a flowchart for combining UNFOLD with a parallel magnetic imaging technique.

FIG. 4 shows a flowchart 50 for an embodiment of a method of combining UNFOLD with a parallel magnetic resonance imaging (MRI) technique. The method begins at 52, with obtaining an MRI data set that was acquired in the way required by the UNFOLD technique combined with the parallel MRI technique, such as SENSE or SMASH (See FIG. 1B). At least some of the points in the data set will have at least four spectra in a temporal frequency domain. At 54, image pixels are Fourier transformed in time. At 56, for a given frequency, SENSE is informed that some of the overlapped object locations are not expected to contribute at this frequency. At 58, the remaining, overlapped signals are separated using parallel imaging. At 60 and 62, the method is continued for all temporal frequencies and all image pixels, respectively.

Figure 5:
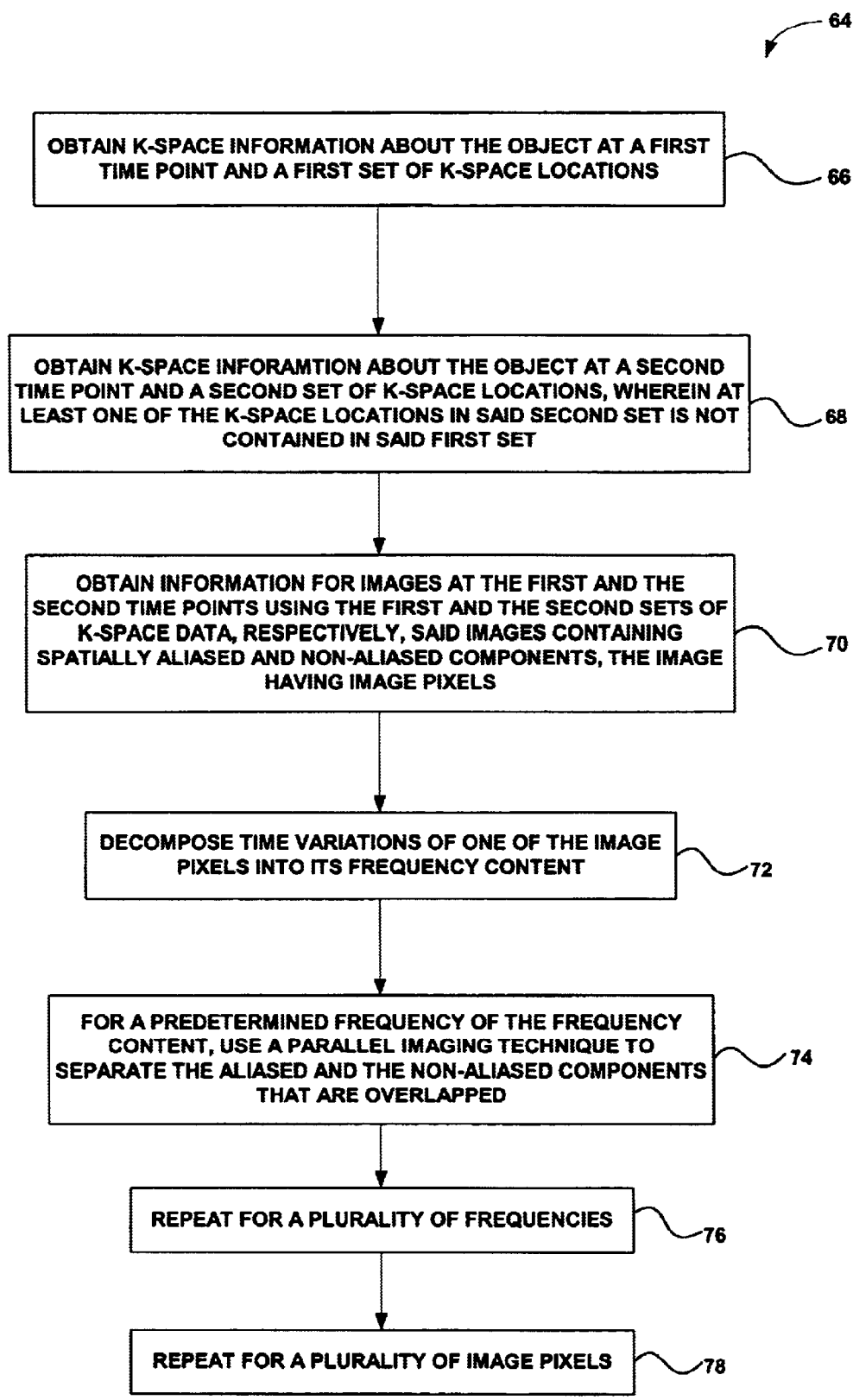
FIG. 5 is another flowchart for combining UNFOLD with a parallel magnetic imaging technique.

FIG. 5 presents another embodiment of how UNFOLD can be combined with a parallel MR imaging technique. The method begins at 66, at which k-space information is obtained about the object at a first time point and a first set of k-space locations. At 68, k-space information is obtained about the object at a second time point and a second set of k-space locations, wherein at least one of the k-space locations in said second set is not contained in said first set. At 70, information is obtained for images at the first and the second time points using the first and the second sets of k-space data, respectively. The images will have image pixels and will contain spatially aliased and non-aliased components. At 72, time variations of one of the image pixels are decomposed into its frequency content. For example, the Fourier transform of the image pixel can be taken through time. At 74, for a predetermined frequency of the frequency content, a parallel imaging technique is used to separate the aliased and the non-aliased components that are overlapped. At 76, step 74 is repeated for a plurality of frequencies. At 78, steps 74 and 76 are repeated for a plurality of image pixels.

Experimental Results

Figure 6:
FIG. 6 is a reconstructed MR image in which the acquired data was reconstructed using a simple root-sum-of-squares algorithm instead of the present UNFOLD-SENSE hybrid method.
Figure 7:
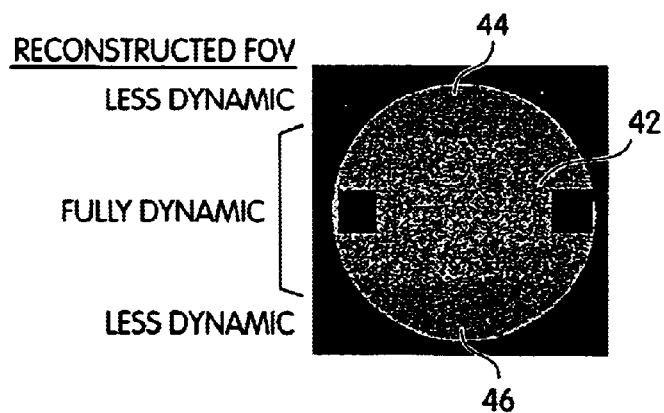
FIG. 7 is the reconstructed MR image of FIG. 6 after using an embodiment of the invention.

The experimental data of FIGS. 6 and 7 were obtained by taking 18 time frames of a static phantom with a four-coil cardiac array. Only 70% of the k-space matrix contained data, and only one k-space line every 4 was used in this truncated k-space matrix (partial Fourier was applied along with SENSE and UNFOLD). The FOV and spatial resolution of a full 256 line k-space matrix was obtained with only 0.7×0.5×0.5×256=45 lines.

FIG. 6 shows an image reconstructed from the experimental data in which fourfold aliasing is present after combining UNFOLD with SENSE and without using the invention. In FIG. 7, the four-fold aliasing of FIG. 6 is completely corrected by using the invention. The reconstructed image of FIG. 7 includes a dynamic portion 42 and less dynamic portions 44 and 46.

A noisy data set for FIG. 7 was intentionally chosen, as noise is an easily observable indicator of temporal resolution. The UNFOLD part of the process does not reduce the signal-to-noise (SNR) efficiency; any SNR decrease/increases comes from a corresponding temporal resolution increase/decrease. The dynamic half of the reconstructed FOV was given a temporal resolution five times higher than the outer half, and this extra resolution comes hand-in-hand with an increase in noise in the dynamic half by a factor of square-root of five. The SENSE part of the algorithm, on the other hand, may amplify noise in some locations (a well-known weakness of SENSE). The invention can be very effective in certain applications, such as cardiac imaging, in which the heart can occupy the fully dynamic half of the full FOV.

The methods of the invention can be accomplished through computer software. The software can be stored on computer usable medium for storing data, such as, for example, but not limited to, floppy disks, magnetic tape, zip disks, hard drives, CD-ROM, optical disks, or a combination of these.

Thus, the MRI techniques of UNFOLD and parallel imaging can be combined while retaining greater than one-quarter of a dynamic field of view. By itself, UNFOLD can typically achieve an acceleration factor of nearly 2. When combined with either SENSE or SMASH, however, UNFOLD can provide half of a fully dynamic FOV and can provide an acceleration nearly twice higher than that of parallel imaging alone (the method can be easily extended to higher acceleration factors). It should be understood that the order of the proposed steps may easily be changed; for example, one could perform the filtering operations on k-space data and then generate images, rather than generating images before performing the filtering operations.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A method for combining an UNFOLD technique with a parallel MR imaging to obtain an MR image of an object, the method comprising:
   a) obtaining first k-space information about the object at a first time point and a first set of k-space locations;
   b) obtaining second k-space information about the object at a second time point and a second set of k-space locations, wherein at least one of the k-space locations in said second set is not contained in said first set;
   c) decomposing time variations of data associated with the first and second k-space information into a corresponding frequency content;

d) for a first frequency of the frequency content, performing first parallel imaging to separate aliased and the non-aliased components that are overlapped; and e) for a second frequency of the frequency content, performing second parallel imaging to separate the aliased and non-aliased components that are overlapped, the second parallel imaging being different from the first parallel imaging.

2. The method according to claim 1, further comprising identifying at least one of aliased and non-aliased components that do not exist at the first frequency.

3. The method according to claim 2, further comprising removing the identified at least one of aliased and non-aliased components that do not exist at the first frequency by zeroing in sensitivity maps the components that did not contribute to the first frequency.

4. The method of claim 1, further comprising producing an MR image.

5. The method of claim 4, wherein producing an MR image comprises producing an MR image having a field of view being substantially one-half dynamic.

6. The method of claim 1, wherein performing the first parallel imaging uses SMASH.

7. The method of claim 1, wherein performing the first parallel imaging uses SENSE.

8. The method of claim 1, wherein performing the first parallel imaging uses SPACE-RIP.

9. A method for combining an UNFOLD technique with a parallel MR imaging to obtain an MR image of an object, the method comprising:

a) obtaining first k-space information about the object at a first time point and a first set of k-space locations;

b) obtaining second k-space information about the object at a second time point and a second set of k-space locations, wherein at least one of the k-space locations in said second set is not contained in said first set;

c) decomposing time variations of data associated with the first and second k-space information into a corresponding frequency content;

d) for a first frequency of the frequency content, performing first parallel imaging that ignores a first set of components that includes at least one of aliased and non-aliased components that do not exist at the first frequency; and e) for a second frequency of the frequency content, performing second parallel imaging that ignores a second set of components that includes at least one of aliased and non-aliased components that do not exist at the second frequency, the first and second sets being different and the first and second frequencies being different.

10. The method of claim 9, wherein the first parallel imaging uses SMASH.

11. The method of claim 9, wherein the first parallel imaging uses SENSE.

12. The method of claim 9, wherein the first parallel imaging uses SPACE-RIP.

13. A computer program product residing on a computer-readable medium and comprising computer-readable, computer-executable instructions for combining an UNFOLD technique with parallel MR imaging to obtain an MR image of an object by causing a computer to:

(a) obtain first k-space information about the object at a first time point and a first set of k-space locations;

(b) obtain second k-space information about the object at a second time point and a second set of k-space locations, wherein at least one of the k-space locations in said second set is not contained in said first set;

(c) decompose time variations of data associated with the first and second k-space information into a corresponding frequency content;

(d) for a first frequency of the frequency content, perform first parallel imaging to separate aliased and non-aliased components that are overlapped; and (e) for a second frequency of the frequency content, perform second parallel imaging to separate the aliased and non-aliased components that are overlapped, the second parallel imaging being different from the first parallel imaging.

14. The computer program product of claim 13, further comprising instructions for causing the computer to identify at least one of the aliased and the non-aliased components that do not exist at the first frequency.

15. The computer program product of claim 14, further comprising instructions for causing the computer to remove the identified at least one of the aliased and the non-aliased components that do not exist at the first frequency by zeroing in sensitivity maps the components that did not contribute to the frequency.

16. The computer program product of claim 13, further comprising instructions for causing the computer to produce an MR image.

17. The computer program product of claim 16, wherein the MR image has a field of view that is substantially one-half dynamic.

18. The computer program product of claim 13, wherein the first parallel imaging uses SMASH.

19. Computer program product of claim 13, wherein the first parallel imaging uses SENSE.

20. Computer program product of claim 13, wherein the first parallel imaging uses SPACE-RIP.

* * * * *

UNITED STATES PATENT AND TRADEMARK OFFICE
CERTIFICATE OF CORRECTION

PATENT NO. : 6,714,010 B2
DATED : March 30, 2004
INVENTOR(S) : Bruno Madore

It is certified that error appears in the above-identified patent and that said Letters Patent is hereby corrected as shown below:

Column 4,
Line 57, delete "a" before the word "parallel".

Column 5,
Line 2, delete the word "the" at the end of the line.
Line 29, delete "a" before the word "parallel".

Column 6,
Line 38, insert the word -- first -- before the word "frequency".

Signed and Sealed this

Twenty-ninth Day of June, 2004

JON W. DUDAS
*Acting Director of the United States Patent and Trademark Office*